United States Patent
Synderman et al.

[11] Patent Number: 5,905,376
[45] Date of Patent: May 18, 1999

[54] METHOD AND APPARATUS FOR DETECTING CORROSION UNDER NON-FERROMAGNETIC COATINGS

[75] Inventors: David M. Synderman, St. Louis; Donald D. Palmer, Jr., Chesterfield; Mark S. Conradi; Daniel J. Leopold, both of St. Louis, all of Mo.; Charles G. Fry, Madison, Wis.

[73] Assignee: McDonnell Douglas Corporation, St. Louis, Mo.

[21] Appl. No.: 08/699,621

[22] Filed: Aug. 19, 1996

[51] Int. Cl.[6] .................................................. G01V 3/00
[52] U.S. Cl. .............................................................. 324/300
[58] Field of Search ..................................... 324/300, 318, 324/307, 229, 230, 231, 235

[56] References Cited

U.S. PATENT DOCUMENTS 5,672,968  9/1997  Miller et al. ............................. 324/300

OTHER PUBLICATIONS

Palmer, Novel NDE For Corrosion Detection: Nuclear Magnetic Resonance, Jan., 1996.
Snyderman, NDE Applications of NMR to Aluminum Corrosion and Composite Materials, May, 1996.
Palmer, Synderman, and Conradi, Characterization of Corrosion in Aluminum Alloys Using Nuclear Magnetic Resonance, 1996.
Fry and Palmer, NDE of Aerospace Materials Using Nuclear Magnetic Resonance, 1994.
Palmer and Leopold, Evaluation of Aluminum Corrosion and Composite Heat Damage Using Magnetic Resonance NDE, 1995.

*Primary Examiner*—Louis Arana
*Attorney, Agent, or Firm*—Bryan Cave LLP

[57] ABSTRACT

A method using nuclear magnetic resonance techniques to detect corrosion within metallic structures such as aluminum under non-ferromagnetic coatings without first having to remove the coatings. The metallic structure is placed within an external static magnetic field. A series of radio frequency preparation and inspection pulses is applied to the metallic with the preparation pulses, and for generating a series of nuclear magnetic resonance response signals with the inspection pulses. The response signals are detected and the amplitudes of the response signals are compared with the spin—spin relaxation time of corrosion for detecting the presence of corrosion in the structure.

21 Claims, 7 Drawing Sheets

METHOD AND APPARATUS FOR DETECTING CORROSION UNDER NON-FERROMAGNETIC COATINGS

FIELD OF THE INVENTION

The present invention relates generally to methods to detect corrosion within metallic structures under non-ferromagnetic coatings and, more particularly, to a method using nuclear magnetic resonance techniques to detect corrosion under non-ferromagnetic coatings without having to first remove the coatings.

BACKGROUND OF THE INVENTION

As large metallic structures, such as, for example, aircraft, age, significant damage to their corrosion protective systems may occur. These corrosion protective systems typically include various sealants, primers and paint. For examples paint on the structure may scratch and crack around fasteners and other joints, sealants may become disbonded from the underlying substrate, and tiny cracks may develop in the coatings through ordinary use. When such damage occurs, water, salt, and other contaminants may intrude through the corrosion protective system and initiate corrosion in the underlying metallic structure.

In general, corrosion occurs by oxidation of the metal in an anodic area with concurrent reduction, typically of hydrogen, in the cathodic region. When corrosion initially develops, it is generally difficult to detect under the paint, primer and/or sealant that may be applied to the surface of the metallic structure. As the metallic structure ages, the potential for failure resulting from stress corrosion induced cracking, disbanding of stiffeners, and structural weakening due to loss of material increases. Having the ability to detect corrosion early in its development would greatly reduce repair costs and, in some instances where the metallic structure is used in, for example, an aircraft, a pressure vessel, a ship, or any other aluminum structure, increase safety. Corrosion on such structures can cause the structures to be life-limited or require patches or fittings to strengthen an area that has had deep corrosion removed. These repairs, which often require structural analysis, are especially costly. Early detection of the corrosion would eliminate the need for such repairs or allow for early and inexpensive repairs to be made.

Several prior art methods exist for detection of corrosion on metallic structures. Such methods include visual inspections, fluorescent penetrant, eddy current, ultrasonics, and radiography. Visual inspection methods (even if aided by a magnifier or borescope) and fluorescent penetrant methods typically only permit detection of corrosion on the outer layer of the structure and do not have the ability to quantify the amount of corrosion. The use of paint, primer and sealants on the structures greatly decreases the effectiveness or usefulness of these two detection methods as generally the coatings must be removed from the structure prior to using either of these two methods. Additionally, visual inspection techniques generally require highly trained personnel with field experience in detecting and identifying corrosion.

Ultrasound, eddy current and radiography techniques are only sensitive to material thinning, not the presence of corrosion. Significant material loss, for examples greater than 5%, must occur before eddy current or ultrasonic techniques can reliably detect material loss due to corrosion. While radiography has proven to be effective in detection of hidden corrosion in certain structures, a quantitative assessment of material loss due to corrosion cannot be made. Radiography has the additional disadvantages of high cost, safety concerns, and lack of portability.

These prior art techniques suffer from significant disadvantages in addition to those previously mentioned. For example, they are severely limited for use in detecting hidden corrosion in inaccessible areas.

Accordingly, there is a continuing need for a nondestructive evaluation method that can be used to detect and characterize hidden corrosion within a complex metallic structure such as an aircraft. Such a method would desirably detect corrosion hidden underneath non-ferromagnetic paint, primer, sealants, polymers, and fillers; be sensitive to water ingress; and demonstrate sensitivity to nascent or incipient corrosion on aluminum and aluminum alloys. In addition, the method would quantify the amount of corrosion present in the structure.

SUMMARY OF THE INVENTION

The above mentioned need is met by the present invention, which is used to detect corrosion in metallic structures, such as aluminum alloys, under non-ferromagnetic coatings. According to the present invention, a corrosion detection system is provided for determining the presence of corrosion in metallic structures. The system is particularly adapted to detect corrosion under non-ferromagnetic coatings without first having to remove the coatings.

The method of the present invention for detecting corrosion comprises the initial step of generating a static, external magnetic field of uniform homogeneity. The metallic structure to test is then placed within the external magnetic field. A series of radio frequency preparation pulses is then applied to the metallic structure, for exciting and disturbing the equilibrium orientation of the hydrogen nuclei within the metallic structure A series of inspection pulses then is applied to generate nuclear magnetic resonance response signals from the metallic structure. These response signals are collected and their amplitude is compared with the known spin-spin and spin-lattice relaxation times of corrosion for detecting the presence of corrosion in the structure.

According to one embodiment, the sequence of preparation and inspection pulses are selected to discriminate nuclear magnetic response signals from the corrosion and the coating on the basis of spin-lattice relaxation times. This method comprises applying a saturation preparation pulse to excite and disturb the equilibrium orientation of the hydrogen nuclei within the metallic structure; waiting a recovery time period for the nuclear magnetization of the hydrogen nuclei to recover toward its equilibrium magnetization; and applying an inspection pulse for generating an NMR response signal proportional to the nuclear magnetization of the hydrogen nuclei.

In another embodiment used to discriminate signals based on spin-lattice relaxation times, an inversion preparation pulse is transmitted to excite and invert the equilibrium orientation of the hydrogen nuclei within the metallic structure After waiting a recovery time period for the nuclear magnetization of the hydrogen nuclei to recover toward its equilibrium magnetization, an inspection pulse for generating an NMR response signal proportional to the nuclear magnetization of the hydrogen nuclei is applied.

The invention further comprises a nuclear magnetic resonance apparatus for detecting corrosion in a metallic structure having a non-ferromagnetic coating. The apparatus consists of a magnet for generating a uniform static magnetic field; means for generating and transmitting RF preparation pulses to the metallic structure placed within the static magnetic field, for exciting and disturbing the equilibrium orientation of the hydrogen nuclei within the metallic structure; means for generating a series of nuclear magnetic resonance response signals with RF inspection pulses; and means for detecting the response signals and for extracting the amplitude of the response signals and comparing the amplitude with the spin-spin relaxation time of corrosion for detecting the presence of corrosion in the structure.

BRIEF DESCRIPTION OF THE DRAWINGS

To facilitate further discussion of the invention, the following drawings are provided in which.

Figure 1:
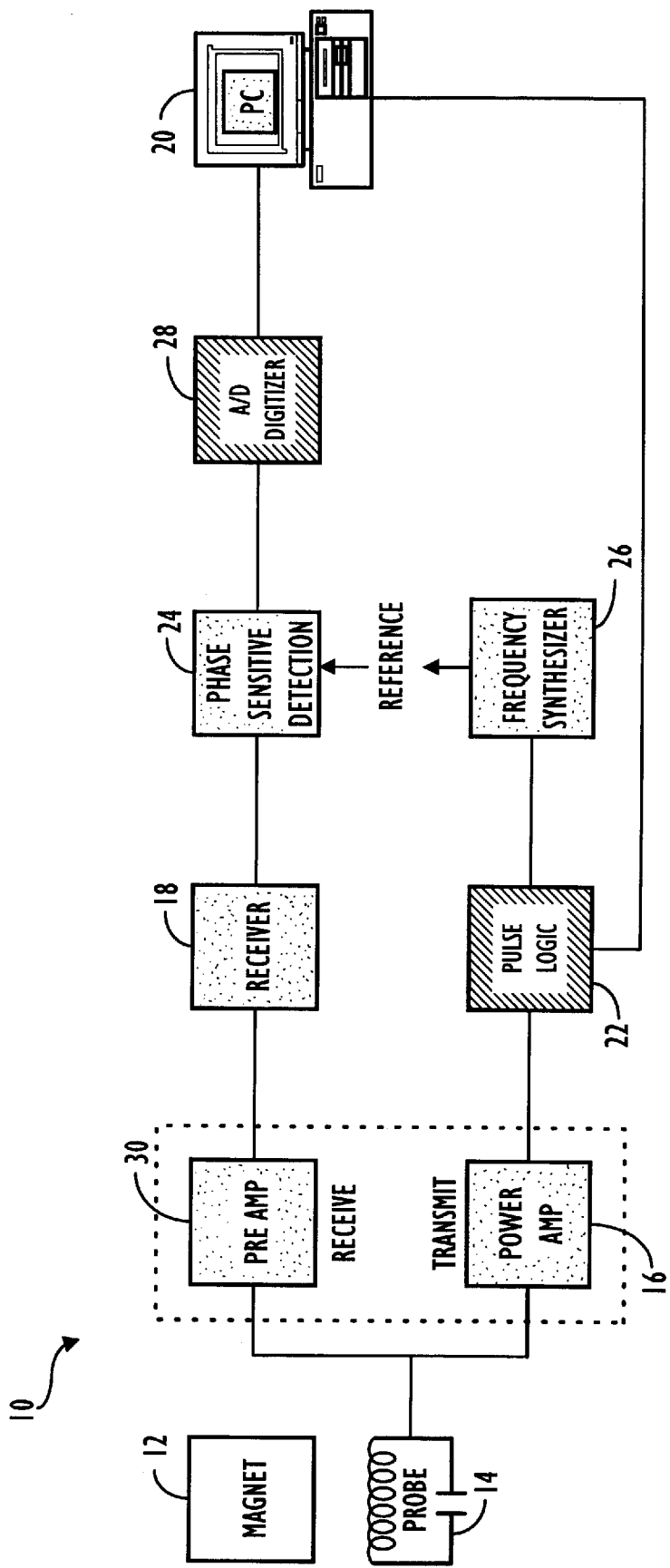
FIG. 1 is a simplified block diagram of the major components of a nuclear magnetic resonance apparatus suitable for use with the invention described herein.

These drawings are for illustrative purposes only and should not be used to unduly limit the scope of the appended claims.

DETAILED DESCRIPTION OF THE INVENTION

The method of the present invention detects corrosion in metallic structures, such as large aircraft components or structures fabricated from aluminum alloys, under paint, primer and other non-ferromagnetic coatings. Although nuclear magnetic resonance ("NMR") has been used extensively in the medical, chemical and petroleum industries, it has never been applied to detect corrosion and moisture entrapped in metallic structures. The method of the present invention detects corrosion by detecting NMR signals from the hydrogen nuclei present in the corrosion product, which is generally a mixture of oxides, hydroxides, oxyhydroxidese and water molecules of hydration. The primary common isotope of hydrogen is detectable through the use of NMR. Since corrosion of an aluminum structure has a hydrogen component, a hydrogen NMR signal may be detected using the method of the present invention. The present invention differentiates the NMR signal from the hydrogen nuclei present in the corrosion product from the hydrogen nuclei within materials such as paint, primer, adhesives, epoxy and sealants.

NMR techniques have the ability to determine very specific chemical and physical information about a material. Aluminum, oxygen, and hydrogen all have isotopes that are detectable using NMR techniques. The NMR spectroscopic technique examines transitions between magnetically separated nuclear spin energy levels. Because most nuclei have a magnetic moment, their preferred orientation is to lie parallel to (or align with) an applied magnetic field. The nuclei can be oriented in a number of discrete directions, the number depending on the spin number of the nucleus (usually denoted (I=0, 1/2, 1, 3/2, . . . ). For example, hydrogen, the nucleus most often examined using NMR, has a spin number of 1/2 and has two possible orientations, parallel to the field, and anti-parallel to the field. As another example, aluminum, with a spin number of 5/2, has six possible orientations: m=5/2, 3/2, 1/2, −1/2, −3/2, −5/2.

An NMR examination process requires excitation of nuclei by RF magnetic fields. The presence of the applied RF magnetic field disturbs the equilibrium orientation of the nuclei. That is, when a sample, such as a metallic structure, is placed in a large, static magnetic field, nuclei with non-zero spin angular momenta become polarized, orienting parallel to the magnetic field direction. To re-establish equilibrium, two things must occur. First, the in-plane magnetization (i.e., perpendicular to the static field) must decay to zero. Second, the magnetization parallel to the static field must grow to its equilibrium value. Thus, after an applied RF pulse, the nuclei relax (i.e., return to equilibrium with the magnetic field), emitting radiation. This emitted RF energy may preferably be detected using appropriate means. The decay of the emitted radiation is characterized by two relaxation times, $T_1$ and $T_2$. $T_1$ is the spin-lattice relaxation time, i.e., the time taken by the nuclei to return to equilibrium along the direction of the externally applied magnetic field. $T_2$ is the time for the inplane magnetization to decay, and is the spin-spin relaxation time.

Any attempt to detect aluminum corrosion requires that the NMR signal of the corrosion product be discriminated from the NMR signals of the other materials contained within the structure. Two such discrimination techniques, based on standard NMR parameters, are used in the method of the present invention. First, the corrosion product can be differentiated based on the spin-spin relaxation time ($T_2$) Second, the corrosion can be discriminated from the surrounding materials based on the spin-lattice relaxation time ($T_1$).

The value of $T_2$ can be determined by acquiring the NMR response signals collected after an RF pulse is transmitted. Because the measured NMR response signals are proportional to the magnitude of the magnetization vector precessing about the static field, the signal decays in a time determined by $T_2$ (defined as the time required for the signal to decay to 1/e of its initial value) This time dependent signal is known as a free induction decay (FID). The spin—spin relaxation time of the nuclei in a corrosion product is determined by the average static internal magnetic field that the nucleus sees. As the average value of the internal fields is reduced, $T_2$ will increase.

The NMR hydrogen signal from corrosion is unique in that the free induction decay lasts approximately 100 $\mu$sec, significantly longer than the free induction decay for rigid solids or polymers such as epoxy (approximately 20 $\mu$sec) and significantly shorter than the free induction decay for liquids, such as, for example, water (at least 1000 μsec, limited under most practical circumstances by the inhomogeneity of the static magnetic field).

Another means for differentiating between corrosion and non-corrosion signals is through spin-lattice relaxation discrimination. The spin-lattice relaxation time, $T_1$, is the time required for the longitudinal magnetization to recover to equilibrium. materials may be differentiated on the basis of their spin-lattice relaxation times. The spin-lattice relaxation time of the nuclei of a substance is determined by the magnitude of the fluctuating magnetic fields with frequency components near the NMR frequency of the nucleus in question. The fluctuating magnetic fields are due to molecular and electronic motions—larger amounts of fluctuating fields lead to shorter $T_1$ values.

Using the procedure described below, the spin-lattice relaxation time for several common materials found in an aircraft structure were measured. The signal received from corrosion was found to have an unusually short spin-lattice relaxation time, for example, approximately 10 msec or less. The spin-lattice relaxation time from other included materials was typically 100–500 msec. As a result, it is possible to distinguish the NMR signal of various included materials from that of the corrosion product. Novel (for this application) spin-lattice relaxation-weighted pulse sequences are used to discriminate between corrosion product and surface coatings. Actual detection of the corrosion product is based on the amplitude of the signal in the correct parameter range, i.e., with correct decay time and short spin-lattice relaxation. Because corrosion has a shorter spin-lattice relaxation time than paint or primer, a rapid-repeat pulse sequence increases the size of the corrosion signal relative to the size of the NMR signal from either paint, primer or other included materials.

The present invention provides an apparatus for detecting the presence of corrosion under surface coatings. FIG. 1 is a simplified block diagram of the major components of a nuclear magnetic resonance apparatus 10 suitable for use with the invention described herein. Of course, many other implementations are possible and within the scope of the present invention. This apparatus comprises, as its principle elements, a main magnet 12 for generating a uniform static magnetic field, a tuned circuit having an RF coil 14 for transmitting an RF pulse and detecting an NMR response signal, a pulsed radio frequency transmitter 16 for generating the RF preparation pulses, an RF receiver as for detecting the NMR response signals, and a computer 20 for controlling the system.

According to the method of the present invention, an external static magnetic field is generated by magnet 12. The magnetic field can be generated by any suitable magnet, such as, for example, an electromagnet, a permanent magnet, or a superconducting magnet. Preferably, the magnet generates a magnetic field of reasonable uniformity (such as, approximately 0.1% variance over the active region) Preferably, the strength of the magnetic field may range between 0.1 Telsa and 2.0 Telsa. In most applications, because of the ability to access only one side of the metallic structure, the magnet may preferably be one-sided.

The metallic structure to be tested (not shown) is then placed within the external magnetic field generated by the magnet 12. Next, a series of RF preparation pulses is transmitted to the metallic structure under test in order to excite the hydrogen nuclei near the metallic structure and disturb the equilibrium orientation of such nuclei.

The RF preparation pulses may be generated and controlled by using a standard pulse generating method, such as, for example, a computer 20, which has pulse-generating logic 22. The RF preparation pulses are amplified by transmitter 16. The NMR RF preparation pulses must be sufficient to penetrate through the surface coating to where the corrosion may reside. Preferably, the preparation pulse has an amplitude of several to 100 Gauss and a duration corresponding to nutation of several revolutions (saturate) or Pi (inverted) to saturate or invert the magnetization of the hydrogen nuclei. Alternatively, an initial preparation pulse may be applied and then the inspection pulses (as defined below) may be used to continue to disturb the magnetization of the hydrogen nuclei. The preparation pulse sequence (i.e., the frequency, amplitude and duration of the preparation pulses) is controlled by computer 20 using its pulse-generating logic 22.

The RF transmitter 16 is gated with pulse envelopes from computer 20 to generate RF pulses having the required modulation to excite an NMR response from the structure under test. The RF pulses may preferably be amplified in an RF power amplifier to levels varying from 0.1 watts to 10 kilowatts and applied to RF surface coil.

The tuned circuit having an RF coil 14 is preferably used to transmit the NMR RF preparation pulses into the area of the metallic structure inside the external magnetic field. Preferably, the RF coil 14 is oriented such that the RF magnetic field generated is primarily perpendicular to the external magnetic field near the surface of the structure. The RF coil 14 may comprise a number of geometric configurations corresponding to the inspection area such as, but not limited to, pancake, figure-8, short solenoid, or meanderline. The RF coil 14 receives an RF pulse from an RF power amplifier 16 and irradiates the metallic structure with the RF signal. The RF coil 16 transmits the RF preparation pulses to the metallic structure and detects an NMR response signal generated therein. Typically, the coil 14 is placed near, above or inside the structure under test. Alternatively, if the structure is small in size, it may be placed within the coil 14.

After each RF preparation pulse (i.e., while the RF transmitter is turned off), the magnetization precesses about the static external magnetic field and induces an electrical signal, which then may be detected by the same RF coil 14 used to emit the RF pulse. Thus, the RF coil 14 acts as both an RF transmitter and an NMR signal detector. Alternatively, separate coils may be used to transmit and receive the RF pulses and signals.

At a selected time after each preparation pulse is applied (the recovery period), an inspection RF pulse is then applied. The inspection pulse generates NMR response signals from the hydrogen nuclei present in the metallic structure under test. The inspection pulse typically has the same amplitude as the preparation pulse and has a duration sufficient to nutate the magnetic spins of the hydrogen 90 degrees. The inspection pulse sequence (i.e., the frequency, amplitude and duration of the inspection pulses) is controlled by the computer 20. These NMR RF returned signals are then received using, preferably, a high sensitivity RF receiver 18 (which may be packaged together along with the RF transmitter 16). The RF coil 14 receives the NMR response signals generated in the metallic structure and transmits these signals through a low-noise pre-amplifier 30 within the receiver 18 to a phase sensitive detector 24. The phase sensitive detector 24 detects the NMR signals received using the RF signal from the RF frequency source 26 as a reference signal. Results of the detection are sampled by an analog-to-digital (A/D) converter or integrator 28. The digital data are then provided to the computer 20.

The computer 20 has means for collecting the data from the A/D converter 28. The computer 20 may also have means for visually displaying the data on a suitable output device, such as a meter, an oscilloscope, or a device which generates an audio tone corresponding to the data. Preferably, the computer 20 also performs routine data processing such as filtering and scaling of data, as well as data storage and retrieval functions.

Successive pulse sequences are applied to the metallic structure to collect NMR responses over a period of time. Once the NMR responses have been collected, the computer 20 may, preferably, plot the intensity of the NMR signals versus time. The amplitude of the NMR returned signals is directly proportional to the magnetization of the nuclei and depends on the fully relaxed signal of the material ($S_0$), the spin-lattice relaxation time of the material ($T_1$) and the recovery time (t) according to:

$$\text{Signal} = S_0(1-e^{-t/T1}).$$

The NMR signal height is proportional to the quantity of corrosion present in the structure through $S_0$ above. Thus, the method of the present invention provides a $T_1$-weighted quantitative measure of the amount of corrosion present on a metallic surface. The magnitude of the NMR RF returned signal may be plotted using an oscilloscope.

Figure 2:
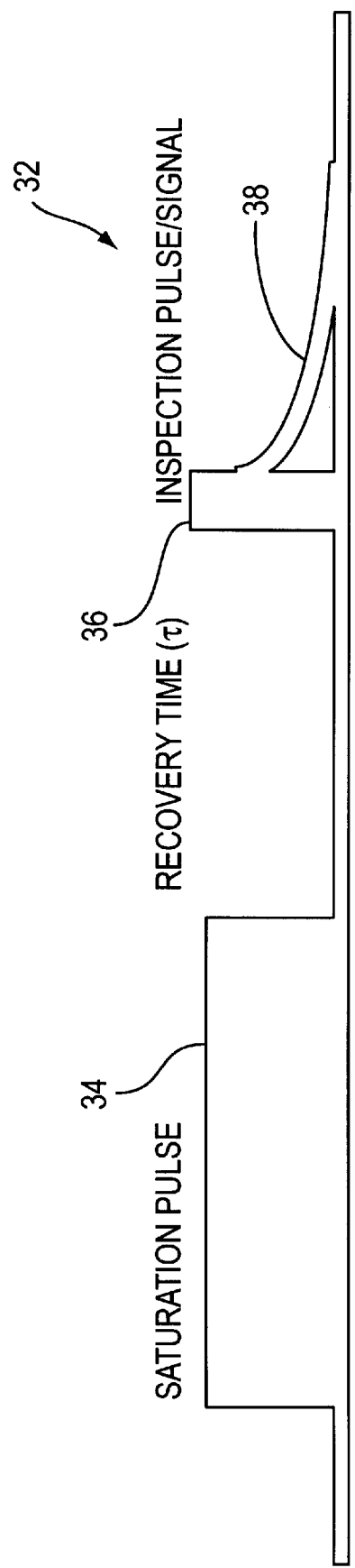
FIG. 2 illustrates a saturate-recover-inspect RF pulse sequence employed with the method of the present invention.

Pulse sequences must be tuned to discriminate between the various hydrogen-bearing materials. The particular pulse sequence employed is also dependent on the relaxation parameter measured. For example, a standard pulse sequence used to emphasize signals with short spin-lattice relaxation time ($T_1$) is the saturate-wait-inspect sequence 32. Such a sequence 32 is illustrated in FIG. 2. The saturation pulse 34 is a long RF pulse (eg. 1 msec) that eliminates the nuclear magnetizations During the waiting (or recovery) period, the nuclear magnetization begins to grow parallel to the external static field. Preferably, the recovery period is chosen to be much shorter than the $T_1$ of the uncorroded surrounding material (including any coatings) and, therefore, the resultant signal due to the coatings of the uncorroded surrounding material following the inspection pulse 36 will be relatively small (i e., the nuclei will not have obtained their equilibrium magnetization). Thus, a material with a shorter $T_1$ (such as corrosion) will have a larger nuclear magnetization vector at the end of a short (compared to $T_1$) waiting period. Finally, the inspection pulse 36 generates an NMR signal 38 proportional to the nuclear magnetization present just prior to the inspection pulse 36. Preferably, the inspection pulse 36 is significantly shorter than the saturation pulse 34, such as, for examples between 5 μsec and 50 μsec. Because the nuclear magnetization of a material with a short $T_1$ (such as corrosion) will grow rapidly during the recovery period, the signal from this material will dominate the total signal acquired. Thus, by plotting the intensity levels of the returned NMR signals, the presence of corrosion may be determined.

When acquiring a signal from several materials simultaneously, it is useful to reduce the recovery period so that it is less than $T_1$ for all of the materials. Thus, materials with a short $T_1$ will contribute disproportionately more to the total signal detected. However, because the $T_1$ of some included materials, such as, for example, certain sealants, may be comparable to the $T_1$ of the corrosion product, an even better $T_1$ discriminated pulse sequence as presented below may preferably be employed to null out the sealant signal.

Figure 3:
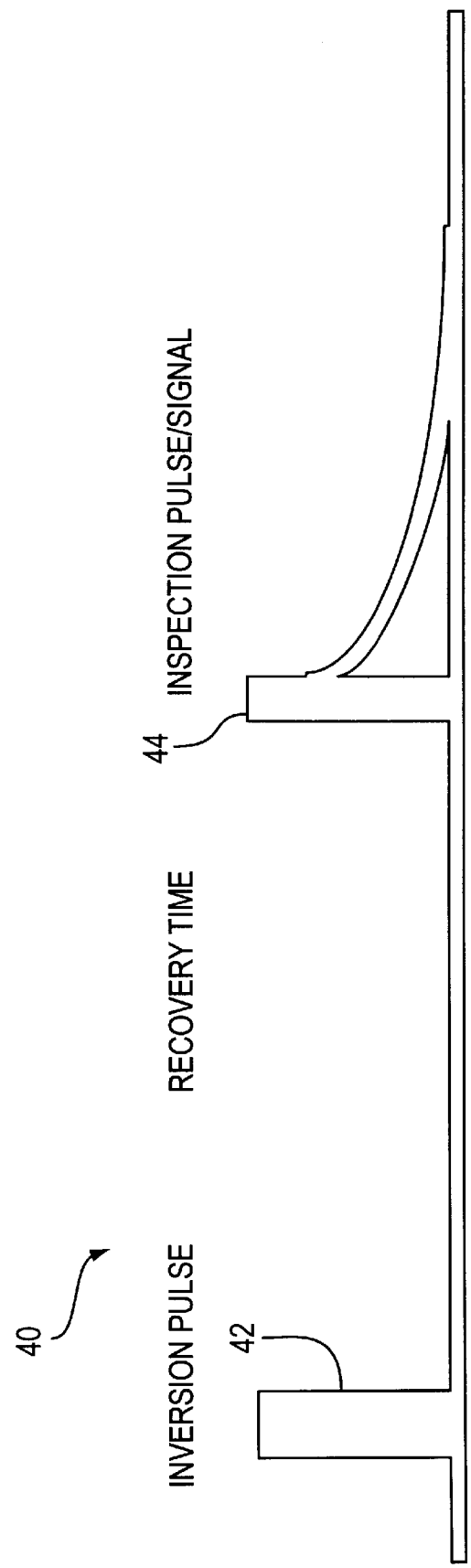
FIG. 3 illustrates an inversion-recover-inspect RF pulse sequence employed with the method of the present invention.

This second method of discriminating between materials with differing $T_1$ values is to use an inversion-recovery pulse sequence. Such a sequence it is shown in FIG. 3. An RF inversion pulse 42 of the appropriate intensity and duration (for example, several to 100 Gauss for 10–100 μsec) is applied so that the NMR signal is inverted. For example, the nuclear magnetization can be inverted with a 180° pulse. Additionally, depending on the application, variations of this pulse sequence may be employed, for example, using a sequence employing two or more inversion pulses followed by an inspection pulse. The nuclear magnetization then recovers parallel to the external field by steadily decreasing its inverted magnetization until it has zero magnitude and then increasing, non-inverted, until it has recovered its equilibrium magnetization. If the metallic structure under test contains two materials, such as sealant and aluminum corrosion, an inspection pulse id can be applied at a time such that the signal from one of them is eliminated by choosing the recovery time such that the nuclear magnetization of the undesired material is passing through zero during the inspection sequence. Thus, this material will not contribute to the net signal received. In this manner, the sealant signal can be differentiated from the signal corresponding to the corrosion product. This method is particularly useful for detecting corrosion under certain sealants, which may have $T_1$ values similar to the $T_1$ values of the corrosion product.

The principles and features of the method of the present invention may be further illustrated by the following examples. Two aluminum sheets were fabricated and then covered with sheets of primer and paint. One of the aluminum sheets (the "corroded sheet") was exposed in an $SO_2$ environment for 336 hours. The other aluminum-specimen was used as the baseline (the "pristine sheet"). Both of the aluminum specimens were then evaluated using the method of the present invention using a figure-eight surface coil and an electromagnet (specifically a Varian XL-100 electromagnets powered by a Varian power supply) having a static field of 2.0 Telsa, which corresponds to an NMR frequency of 85 MHz for hydrogen nuclei. A saturate-recover-inspect pulse sequence was employed, with a 2.0 msec saturation pulse, a recovery time of 5 msec, and an inspection pulse of 10 μsec. 4,000 transients were acquired and signal averaged.

Figure 4:
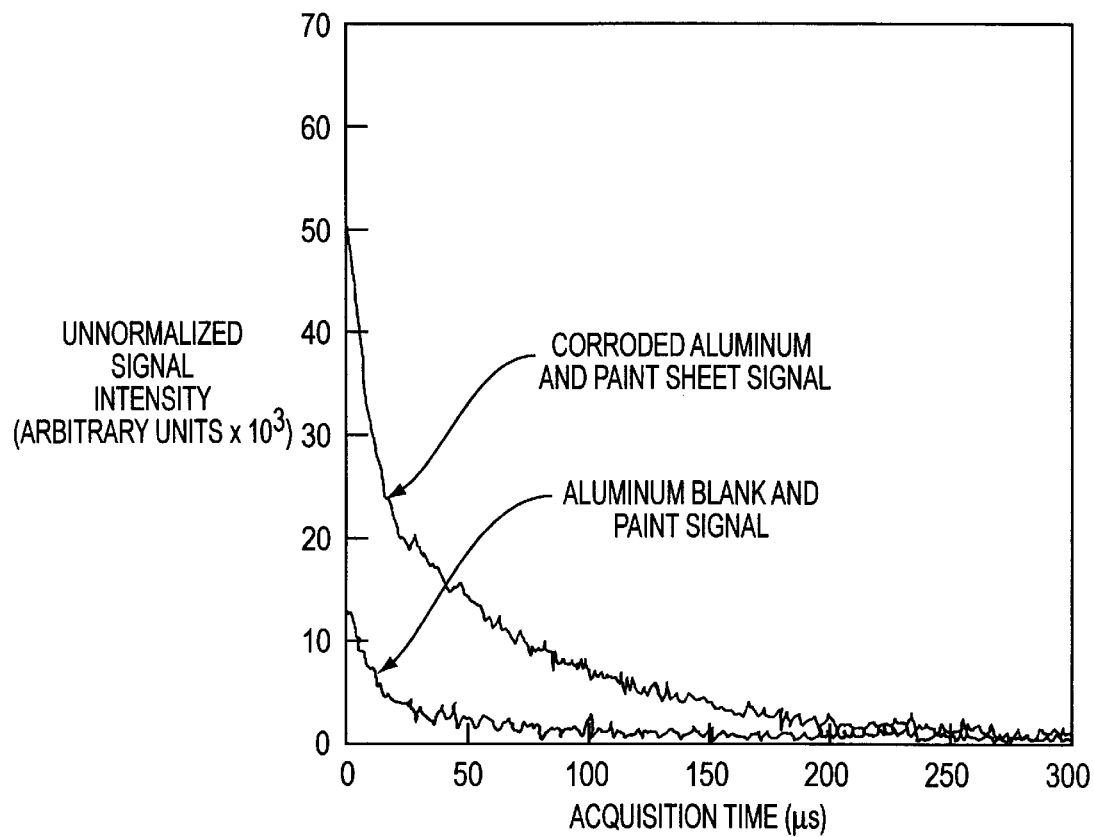
FIG. 4 illustrates the relative amplitudes of NMR response signals versus time generated using the method of the present invention for a pristine and a corroded sheet of aluminum having a layer of paint generated using a saturate-recover-inspect pulse sequence with an external magnetic field of 2.0 Telsa.

FIG. 4 shows a plot of the relative amplitudes of the returned NMR signals versus time. The results indicate that the hydrogen NMR response signal from the corroded sheet was much stronger than, and could clearly be discriminated from, the response signal from the pristine sheet. The results also validate that the presence of corrosion could be detected without removal of the surface coatings.

By analyzing the time required for the response signal to decay, the presence of corrosion may be determined. That is, knowing that the spin-spin relaxation time for corrosion is approximately 100 μsec, examining the NMR response signal plot for signals of this duration, the presence of corrosion can be determined.

Figure 5:
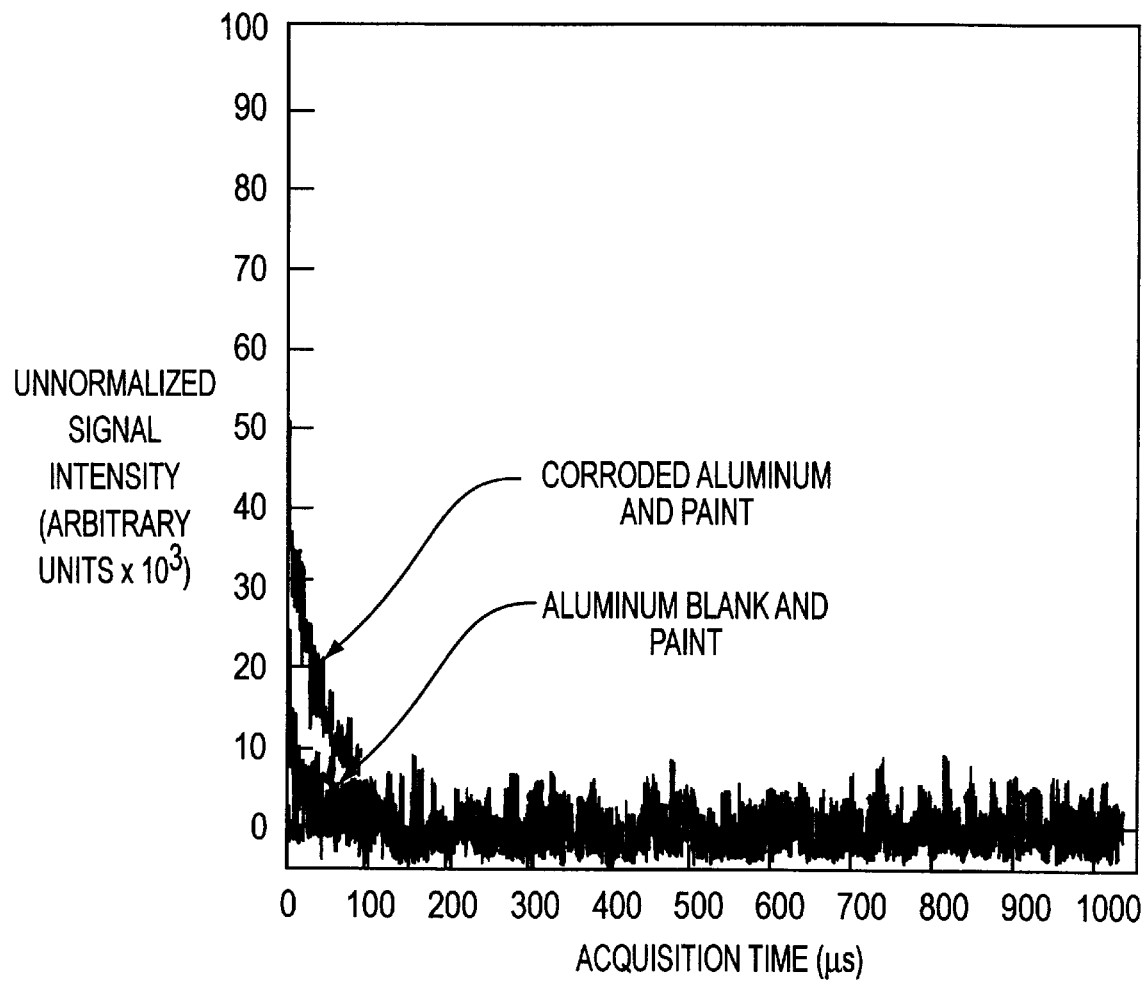
FIG. 5 illustrates the relative amplitudes of NMR response signals versus time generated using the method of the present invention for a pristine and a corroded sheet of aluminum having a layer of paint generated using a saturate-recover-inspect pulse sequence with a low external magnetic field of 0.05 Telsa.

A second evaluation was performed using an external magnetic field of 0.5 Telsa, which corresponds to a hydrogen NMR frequency of 21.25 MHz. The same pulse sequences were used for this lower magnetic field evaluation. However, the recovery time was decreased to 0.5 msec, because the spin-lattice relaxation times for all materials decreases as the static external field is reduced. The saturation pulse was 2 msec and the inspection pulse was 4 μsec. 10,000 transients were acquired and signal averaged. The results, as shown in FIG. 5, indicated that at even this low magnetic field, the presence of corrosion was still identifiable without removal of the paint and primer layers.

Figure 6:
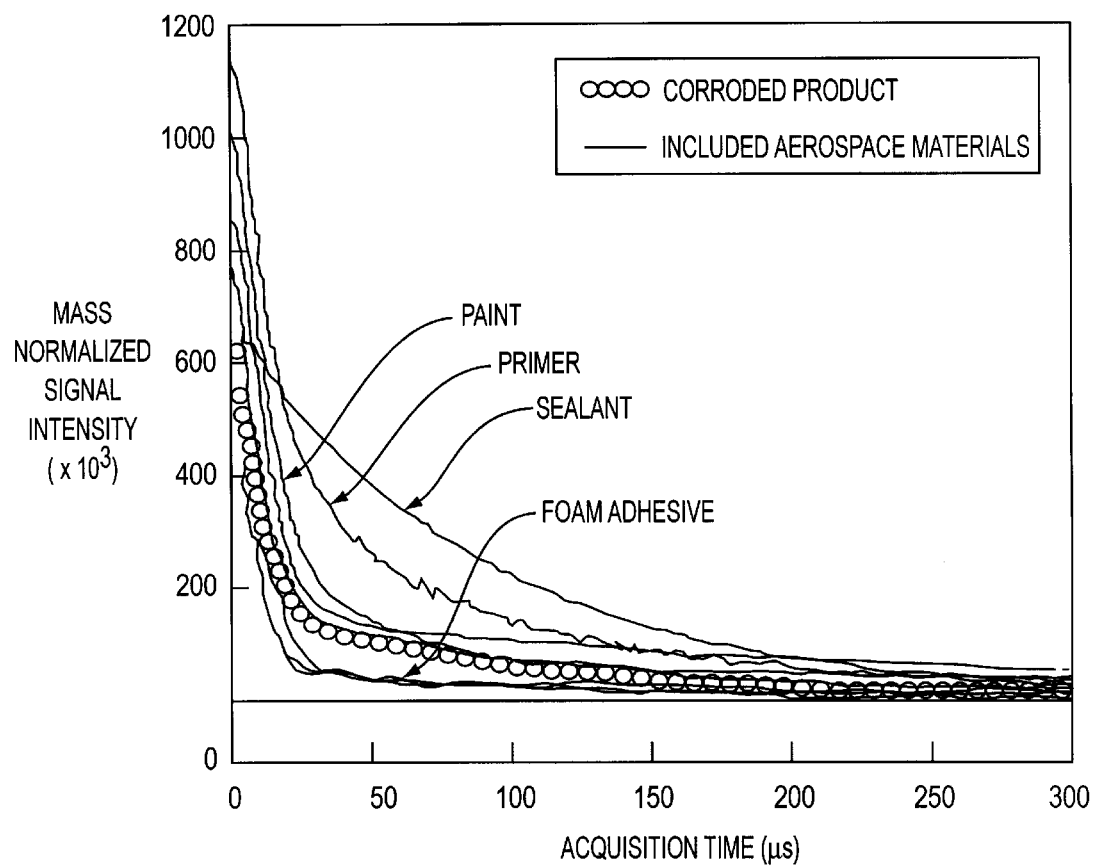
FIG. 6 illustrates the relative amplitudes of fully relaxed NMR response signals versus time for corrosion and various included materials.

As discussed above, the presence of corrosion may also be detected by discriminating on the basis of spin-lattice relaxation times. For example, FIG. 6 shows a plot of NMR response signals from an aluminum corrosion product and from various aircraft materials (including paint, primer, sealant, and foam adhesive) in a single plot. The data for this plot was acquired by using a saturate-recover-inspect pulse sequence. The recovery period selected (20 seconds) was substantially greater than the spin-lattice relaxation time for all of the products and materials included. This corresponds to a fully recovered longitudinal magnetization for all spin species. As is shown in FIG. 6, the NMR signal from the corrosion product can not be detected because of the much larger signal from other materials.

However, if the recovery period is reduced such that it is less than the spin-lattice relaxation time for all of the materials, any material with a short spin-lattice relaxation time (such as corrosion) will contribute disproportionately to the total signal. Because corrosion has a shorter spin-lattice relaxation time than paint or primer, a pulse sequence using a short recovery period increases the size of the corrosion signal relative to the size of the NMR signal from either the paint or primer.

Figure 7:
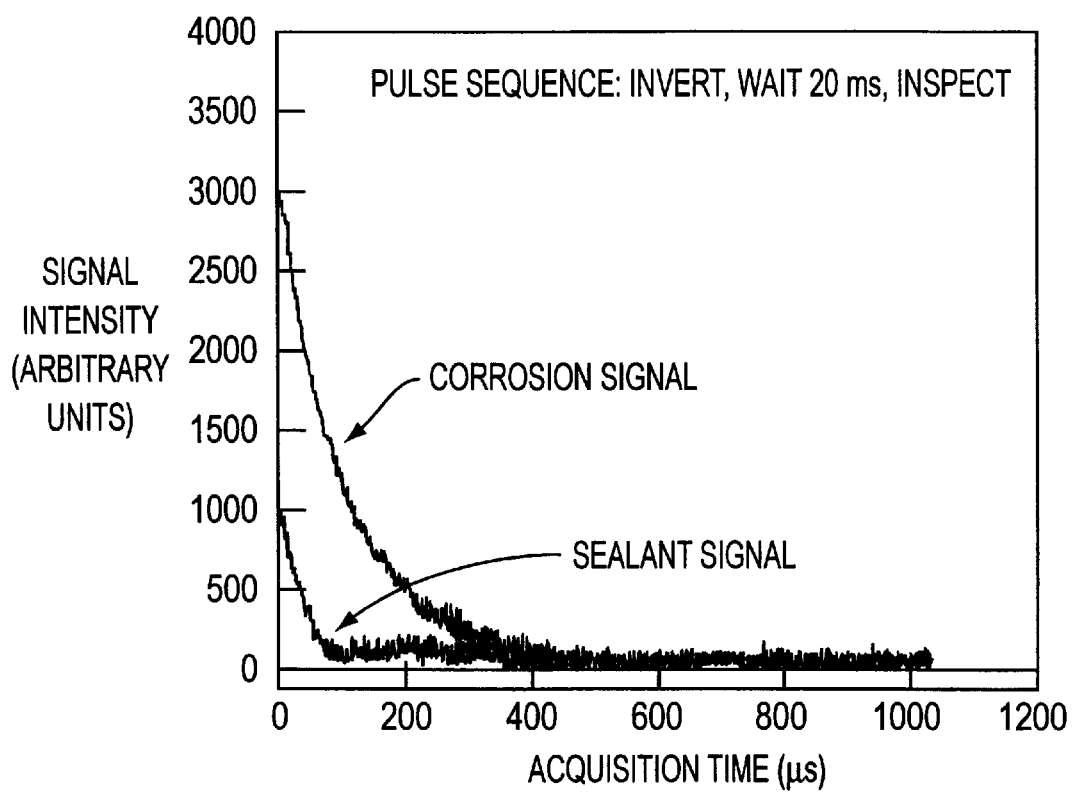
FIG. 7 illustrates the relative amplitudes of fully relaxed NMR response signals versus time for a corrosion signal and a sealant signal using an inversion-recover-inspect pulse sequence.

If it is known that the spin-lattice relaxation time for the corrosion product is close to the spin-lattice relaxation time for another included material (such as certain sealants) the invert-recover-inspect pulse sequence may preferably be employed such that the response signal from the sealant is minimized with respect to the response signal from the corrosion product as discussed above. This is shown in FIG. 7, which shows a plot of a response signal from a corrosion product and a response signal from a sealant. The pulse sequence employed was an invert-recover-inspect sequence, wherein the recovery period was set at 20 msec. Thus by shortening the recovery time to take advantage of the relatively short spin-lattice relaxation time of corrosion, the presence of the corrosion product can be detected.

The method of the present invention may be used to detect corrosion under surface coatings such as paint, primer, sealants, and other non-ferromagnetic coatings without having to remove the coatings. The method detects the corrosion product directly, as opposed to detecting material loss, which makes the technique sensitive to nascent corrosion formation. While, in general, the method of the present invention is used to detect corrosion under non-ferromagnetic coatings, it may function equally as well with thin, skin depth metallic coatings.

Although the present invention has been described in considerable detail with reference to certain preferred versions thereof, other versions are possible without departing from the spirit and scope of the present invention. Therefore the spirit and scope of the appended claims should not be limited to the description of the preferred embodiments described herein. For example, the process of this invention may be used to detect moisture in structures or fuel leaks.

What is claimed is:

1. A method for non-destructive detection of corrosion in aluminum alloys disposed under a non-ferromagnetic coating the corrosion comprising hydrogen nuclei present therein from which nuclear magnetic resonance signals are generated, the method comprising the steps of detecting the nuclear magnetic resonance signals from the hydrogen nuclei for non-destructively detecting the presence of corrosion in the aluminum alloy without removal of the non-ferromagnetic coating.

2. A method in accordance with claim 1 wherein the nuclear magnetic resonance signal detecting step comprises the steps of:
   a. providing a static external magnetic field over a detection area;
   b. providing a source of radio-frequency pulses to the detection area for causing a plurality of nuclear magnetic resonance radio-frequency response signals; and
   c. detecting the nuclear magnetic resonance radio-frequency response signals for detecting the presence of the corrosion.

3. A method in accordance with claim 2 wherein the step of generating the magnetic field comprises generating the magnetic field by a magnet selected from the group consisting of an electromagnet, a permanent magnet, and a superconducting magnet.

4. A method in accordance with claim 2 wherein uniformity of the magnetic field varies less than 0.1% over the active region.

5. A method in accordance with claim 2 wherein the external magnetic field is selected to be in the range 0.5 to 2.0 Telsa.

6. A method in accordance with claim 2 further comprising the step of plotting the magnitude of the response signals versus time for extracting the amplitude of the response signals and comparing the amplitude with the spin—spin relaxation time of corrosion for detecting the presence of corrosion in the structure.

7. A method in accordance with claim 2 further comprising the step of displaying the response signals on an output display device.

8. A method for detecting corrosion comprising hydrogen nuclei having a spin—spin relaxation time, in a metallic structure having a non-ferromagnetic coating, comprising the steps of:
   a. generating a static, external magnetic field;
   b. placing the metallic structure within the external magnetic field;
   c. applying a sequence of radio frequency preparation and inspection pulses to the metallic structure, for exciting and disturbing the equilibrium orientation of the hydrogen nuclei within the metallic structure with the preparation pulses, and for generating a series of nuclear magnetic resonance response signals with the inspection pulses;
   d. detecting and collecting the response signals, and
   e. extracting the amplitude of the response signals and comparing the amplitude with the spin—spin relaxation time of corrosion for detecting the presence of corrosion in the structure.

9. A method in accordance with claim 8 wherein the step of generating the magnetic field comprises generating the magnetic field by a magnet selected from the group consisting of an electromagnet, a permanent magnet, and a superconducting magnet.

10. A method in accordance with claim 8 wherein uniformity of the magnetic field varies less than 0.1% over the active region.

11. A method in accordance with claim 8 wherein the external magnetic field is selected to be in the range 0.5 to 2.0 Telsa.

12. A method in accordance with claim 8 further comprising the step of plotting the magnitude of the response signals versus time for extracting the amplitude of the response signals and comparing the amplitude with the spin—spin relaxation time of corrosion for detecting the presence of corrosion in the structure.

13. A method in accordance with claim 8 further comprising the step of displaying the response signals on an output display device.

14. A method in accordance with claim 8 wherein the sequence of preparation and inspection pulses are selected to discriminate nuclear magnetic response signals from the corrosion and the coating on the basis of spin-lattice relaxation times.

15. A method in accordance with claim 8 wherein each sequence of preparation and inspection pulses comprises the steps of:
 (1) applying a saturation preparation pulse to excite and disturb the equilibrium orientation of the hydrogen nuclei within the metallic structure;
 (2) waiting a recovery time period for the nuclear magnetization of the hydrogen nuclei to recover toward its equilibrium magnetization; and
 (3) applying an inspection pulse for generating an NMR response signal proportional to the nuclear magnetization of the hydrogen nuclei.

16. A method in accordance with claim 15 wherein the recovery time period is shorter than the spin-lattice relaxation time of corrosion for increasing the amplitude of the response signals generated from the corrosion.

17. A method in accordance with claim 8 wherein each sequence of preparation and inspection pulses comprises the steps of:
 (1) applying a plurality of inversion preparation pulses to excite and invert the equilibrium orientation of the hydrogen nuclei within the metallic structure;
 (2) waiting a recovery time period for the nuclear magnetization of the hydrogen nuclei to recover toward its equilibrium magnetization; and
 (3) applying an inspection pulse for generating an NMR response signal proportional to the nuclear magnetization of the hydrogen nuclei.

18. A method in accordance with claim 17 wherein the coating on the metallic structure comprises a coating having a spin-lattice relaxation time between 50 and 100 percent greater than the spin-lattice relaxation time of the corrosion and wherein the recovery time period is selected such that the nuclear magnetization of the coating is minimized during the inspection pulse.

19. A method for detecting corrosion comprising hydrogen nuclei having a spin—spin relaxation time, in a metallic structure having a non-ferromagnetic coatings comprising the steps of:
 a. generating a static, external magnetic field;
 b. placing the metallic structure within the external magnetic field;
 c. applying a preparation pulse to excite and disturb the equilibrium orientation of the hydrogen nuclei within the metallic structure;
 d. waiting a recovery time period for the nuclear magnetization of the hydrogen nuclei to recover toward its equilibrium magnetization;
 e. applying an inspection pulse for generating an NMR response signal proportional to the nuclear magnetization of the hydrogen nuclei;
 f. detecting and collecting the response signal;
 g. repeating steps c–f n times, wherein n is greater than it for collecting a series of NMR response signals; and
 h. extracting the amplitude of the response signals and comparing the amplitude with the spin—spin relaxation time of corrosion for detecting the presence of corrosion in the structure.

20. A nuclear magnetic resonance apparatus for non-destructive detection of corrosion in aluminum alloys disposed under a non-ferromagnetic coating, the corrosion comprising hydrogen nuclei present therein from which nuclear magnetic resonance signals are generated, the apparatus comprising means for detecting the nuclear magnetic resonance signals from the hydrogen nuclei and means for extracting the amplitude of the response signals for non-destructively detecting the presence of corrosion in the aluminum alloy without removal of the non-ferromagnetic coating.

21. A nuclear magnetic resonance apparatus for detecting corrosion comprising hydrogen nuclei having a spin—spin relaxation time, in a metallic structure having a non-ferromagnetic coating, comprising:
 a. magnet means for generating a uniform static magnetic field;
 b. means for emitting RF preparation and inspection pulses to the metallic structure placed within the static magnetic field, for exciting and disturbing the equilibrium orientation of the hydrogen nuclei within the metallic structure with the preparation pulses, and for generating a series of nuclear magnetic resonance response signals with the inspection pulses;
 c. RF control means connected to the means for emitting for causing the means for emitting to successively emit the RF preparation and inspection pulses;
 d. means for detecting and collecting the response signals; and
 e. means for extracting the amplitude of the response signals and comparing the amplitude with the spin-spin relaxation time of corrosion for detecting the presence of corrosion in the structure.

* * * * *

UNITED STATES PATENT AND TRADEMARK OFFICE
CERTIFICATE OF CORRECTION

PATENT NO. : 5,905,376
DATED : May 18, 1999
INVENTOR(S) : SYNDERMAN et al.

It is certified that error appears in the above-identified patent and that said Letters Patent is hereby corrected as shown below:

On the title page, item [57] Abstract, lines 6 and 7, after "applied to the metallic" and before "with the preparation pulses" insert --structure, for exciting and disturbing the equilibrium orientation of the hydrogen nuclei within the metallic structure--.

```
    Col 1, line 33;
replace "disbanding" with --disbonding--

Col 5, line 8;
replace "materials" with --Materials--
```

Signed and Sealed this

Twenty-first Day of September, 1999

Attest:

Q. TODD DICKINSON

Attesting Officer

Acting Commissioner of Patents and Trademarks